US008957681B2

(12) United States Patent
Hernando et al.

(10) Patent No.: US 8,957,681 B2
(45) Date of Patent: Feb. 17, 2015

(54) SYSTEM AND METHOD FOR MAGNETIC RESONANCE IMAGING WATER-FAT SEPARATION WITH FULL DYNAMIC RANGE USING IN-PHASE IMAGES

(75) Inventors: Diego Hernando, Madison, WI (US); Scott B Reeder, Middleton, WI (US)

(73) Assignee: Wisconsin Alumni Research Foundation, Madison, WI (US)

( * ) Notice: Subject to any disclaimer, the term of this patent is extended or adjusted under 35 U.S.C. 154(b) by 425 days.

(21) Appl. No.: 13/400,343

(22) Filed: Feb. 20, 2012

(65) Prior Publication Data

US 2013/0214781 A1    Aug. 22, 2013

(51) Int. Cl.
*G01V 3/00* (2006.01)

(52) U.S. Cl.
USPC .......................................... 324/309

(58) Field of Classification Search
CPC .............. G01V 33/54; G01V 33/3415; G01V 33/4828; G01V 33/5613–33/5615; G01V 3/00
USPC ................................. 324/300–322
See application file for complete search history.

(56) References Cited

U.S. PATENT DOCUMENTS

| 5,909,119 | A * | 6/1999 | Zhang et al. ................... 324/309 |
| 6,856,134 | B1 | 2/2005 | Reeder et al. |
| 7,429,861 | B2 * | 9/2008 | Deimling ....................... 324/307 |
| 7,518,364 | B1 * | 4/2009 | Cukur ............................ 324/309 |
| 7,592,810 | B2 * | 9/2009 | Reeder et al. ................. 324/309 |
| 7,664,541 | B2 * | 2/2010 | Wang et al. .................... 600/410 |
| 7,924,003 | B2 | 4/2011 | Yu et al. |
| 8,395,387 | B2 * | 3/2013 | Deimling ....................... 324/309 |
| 8,488,859 | B2 * | 7/2013 | Gilson ........................... 382/131 |
| 8,503,751 | B2 * | 8/2013 | Wang et al. .................... 382/131 |
| 8,692,551 | B2 * | 4/2014 | He et al. ......................... 324/309 |
| 2007/0247153 | A1 | 10/2007 | Yu et al. |
| 2011/0140696 | A1 | 6/2011 | Yu |

OTHER PUBLICATIONS

Glover, Multipoint Dixon Technique for Water and Fat Proton and Susceptibility Imaging, Journal of Magnetic Resonance Imaging, 1991, 1:521-530.
Hernando, et al., Multipeak Fat-Corrected Complex R2* Relaxometry: Theory, Optimization, and Clinical Validation, Magnetic Resonance in Medicine, 2012, 000:000-000, pp. 1-13.
Hernando, et al., R2* Estimation Using "In-Phase" Echoes in the Presence of Fat: The Effects of Complex Spectrum of Fat, Journal of Magnetic Resonance Imaging, 2013, 37:717-726.

(Continued)

*Primary Examiner* — Dixomara Vargas
(74) *Attorney, Agent, or Firm* — Quarles & Brady, LLP (57) ABSTRACT

A magnetic resonance imaging ("MRI") system and method for producing an image of a subject with the MRI system in which signal contributions of water and fat are separated are provided. A plurality of in-phase echoes formed at a plurality of different echo times are sampled to acquire k-space data. The in-phase echoes include signal contributions from water and fat that are in-phase with each other. The signal contributions from water and fat are then separated by fitting only those echo signals that are in-phase echo signals to a signal model that models a fat spectrum as including multiple resonance peaks. From these signal contributions, an image of the subject depicting a desired amount of signal contribution from water and a desired amount of signal contribution is produced.

19 Claims, 6 Drawing Sheets

(56) References Cited

OTHER PUBLICATIONS

Meisamy, et al., Quantification of Hepatic Steatosis with T1-Independent, T2*-Corrected MR Imaging with Spectral Modeling of Fat: Blinded Comparison with MR Spectroscopy, Radiology, 2011, 258(3):767-775.
Reeder, et al., Quantification of Hepatic Steatosis With MRI: The Effects of Accurate Fat Spectral Modeling, Journal of Magnetic Resonance Imaging, 2009, 29:1332-1339.
Reeder, et al., Quantitative Assessment of Liver Fat With Magnetic Resonance Imaging and Spectroscopy, Journal of Magnetic Resonance Imaging, 2011, 34:729-749.
Yu, et al., Combination of Complex-Based and Magnitude-Based Multiecho Water-Fat Separation for Accurate Quantification of Fat-Fraction, Magnetic Resonance in Medicine, 2011, 66:199-206.
PCT International Search Report and Written Opinion, PCT/US2013/025852, May 22, 2013, 7 pages.
Bydder, et al., Relaxation Effects in the Quantification of Fat Using Gradient Echo Imaging, Magn. Reson. Imaging, 2008, 26(3):347-359.
Dahnke, et al., Limits of Detection of SPIO at 3.0 T Using T2* Relaxometry, Magn. Reson. Med., 2005, 53 (5):1202-1206.
Dixon, Simple Proton Spectroscopic Imaging, Radiology, 1984, 153(1):189-194.
Hamilton, et al., In Vivo Characterization of the Liver Fat 1H MR Spectrum, NMR Biomed, 2011, 24(7):784-790.
Liu, et al., Fat Quantification with IDEAL Gradient Echo Imaging: Correction of Bias from T1 and Noise, Magn. Reson. Med., 2007, 58(2):354-364.
Wehrli, et al., Osteoporosis: Clinical Assessment with Quantitative MR Imaging in Diagnosis, Radiology, 1995, 196 (3):631-641.
Yu, et al., Multi-Echo Water-Fat Separation and Simultaneous R2* Estimation with Multi-Frequency Fat Spectrum Modeling, Magn. Reson. Med., 2008, 60(5):1122-1134.

* cited by examiner

FIG. 6

SYSTEM AND METHOD FOR MAGNETIC RESONANCE IMAGING WATER-FAT SEPARATION WITH FULL DYNAMIC RANGE USING IN-PHASE IMAGES

STATEMENT REGARDING FEDERALLY SPONSORED RESEARCH

This invention was made with government support under DK083380 and EB010384 awarded by the National Institutes of Health. The government has certain rights in the invention.

BACKGROUND OF THE INVENTION

The field of the invention is systems and methods for magnetic resonance imaging ("MRI"). More particularly, the invention relates to systems and methods for performing fat-water separation with the ability to measure a full dynamic range of fat fraction values.

MRI uses the nuclear magnetic resonance ("NMR") phenomenon to produce images. When a substance such as human tissue is subjected to a uniform magnetic field, such as the so-called main magnetic field, $B_0$, of an MRI system, the individual magnetic moments of the nuclei in the tissue attempt to align with this $B_0$ field, but precess about it in random order at their characteristic Larmor frequency, $\omega$. If the substance, or tissue, is subjected to a so-called excitation electromagnetic field, $B_1$, that is in the plane transverse to the $B_0$ field and that has a frequency near the Larmor frequency, the net aligned magnetic moment, referred to as longitudinal magnetization, may be rotated, or "tipped," into the transverse plane to produce a net transverse magnetic moment, referred to as transverse magnetization. A signal is emitted by the excited nuclei or "spins," after the excitation field, $B_1$, is terminated, and this signal may be received and processed to form an image.

A method for water-fat separation known as IDEAL was developed for imaging spin species such as fat and water. As described in U.S. Pat. No. 6,856,134 issued on Feb. 15, 2005 and entitled "Magnetic Resonance Imaging With Fat-Water Signal Separation," the IDEAL method employs pulse sequences to acquire multiple images at different echo times ("TE") and an iterativeleast squares approach to estimate the separate water and fat signal components. In the original description of the IDEAL method, the fat signal was modeled as having one resonant frequency, as did all other Dixon methods. However, recently, a multi-peak IDEAL method that models the fat spectrum as having multiple resonance frequencies was developed, as described in U.S. Pat. No. 7,924,003, which is herein incorporated by reference in its entirety.

Multi-point water-fat separation methods, from the early Dixon methods to more recently IDEAL algorithms, all must address the intrinsic challenge of water-fat ambiguity. This ambiguity problem arises due to the fact that the signal behavior of two chemical species with a single NMR spectrum, but at different chemical shifts, may appear identical in the presence of $B_0$ inhomogeneities. In this situation, the signal from a voxel containing substantially only one species can be identical for two possible scenarios. First, where the voxel contains a first species, such as water, with a given $B_0$ off-resonance value, and second, where the voxel contains a second species, such as fat, with a different $B_0$ off-resonance value. For example, with water and fat, a voxel containing only fat is very similar to a voxel containing only water that is off-resonance by approximately 217 Hz at a $B_0$ field strength of 1.5 T. This ambiguity is the fundamental challenge of chemical shift based chemical species separation, and for water and fat is, therefore, commonly referred to as the "water-fat ambiguity." Such ambiguities often result in water-fat swaps, in which a voxel containing, for example, water is mischaracterized as containing fat.

The challenge of water-fat ambiguity is commonly addressed by assuming a slowly and smoothly varying $B_0$ field inhomogeneity map, or "field map," without abrupt discontinuities, or "jumps," in the field map that would occur when there is a water-fat swap. Previous multi-echo water-fat separation methods attempted to resolve the water-fat ambiguity by enforcing field map smoothness. However, these algorithms are typically based on variations of region growing algorithms, and are similar in principle to two-dimensional phase unwrapping methods, which are well known to be error prone and sensitive to noise and the physical characteristics of the object, such as spatially discontinuous regions.

It would therefore be desirable to provide a system and method for performing water-fat separation and fat quantification that is free from ambiguities and that is insensitive to magnetic field inhomogeneities.

SUMMARY OF THE INVENTION

The present invention overcomes the aforementioned drawbacks by providing a system and method for performing accurate water-fat separation by fitting in-phase echo signals to a signal model that characterizes the fat spectrum as having multiple resonance peaks. By fitting only echoes that are substantially in-phase with each other to a signal model, ambiguities between water and fat are effectively removed.

It is an aspect of the invention to provide a method for producing an image of a subject with an MRI system in which signal contributions of water and fat are separated. The MRI system is used to acquire k-space data by sampling a plurality of in-phase echo signals that are formed at a plurality of different echo times that occur when signal contributions of water and fat are in-phase with each other. Signal contributions of water and fat are separated by fitting only those of the plurality of echo signals having water and fat substantially in-phase with each other to a signal model that models a fat spectrum as including multiple resonance peaks. Using these separated signal contributions, an image of the subject depicting a desired amount of signal contribution from water and a desired amount of signal contribution from fat is produced.

It is another aspect of the invention to provide a method for improving the signal-to-noise ratio of an image produced with the aforementioned method. The MRI system us used to acquire k-space data by sampling a plurality of out-of-phase echo signals that are formed at a plurality of different echo times that occur when signal contributions of water and fat are out-of-phase with each other. The separated signal contributions that are determined by fitting only those echoes that are in-phase are selected as initial estimate values, and then the signal contributions of water and fat are separated again by fitting the plurality of in-phase echo signals and the plurality of out-of-phase echo signals to a signal model that models a fat spectrum as including multiple resonance peaks. During this fitting, the selected initial estimate values are used to avoid convergence at an incorrect local minimum.

It is another aspect of the invention to provide an MRI system configured to perform water-fat separation. The MRI system includes a magnet system configured to generate a polarizing magnetic field about at least a portion of a subject arranged in the MRI system, a plurality of gradient coils configured to apply at least one gradient field to the polarizing magnetic field, a radio frequency (RF) system configured to apply an RF field to the subject and to acquire magnetic resonance (MR) image data therefrom, and a computer system. The computer system is programmed to direct the MRI system to acquire MR image data from a subject by sampling a plurality of in-phase echo signals that are formed at a plurality of different echo times that occur when signal contributions of water and fat are in-phase with each other, separate signal contributions of water and fat by fitting the plurality of in-phase echo signals to a signal model that models a fat spectrum as including multiple resonance peaks, and produce an image of the subject depicting a desired amount of signal contribution from water and a desired amount of signal contribution from fat using the separated signal contributions.

The foregoing and other aspects and advantages of the invention will appear from the following description. In the description, reference is made to the accompanying drawings, which form a part hereof, and in which there is shown by way of illustration a preferred embodiment of the invention. Such embodiment does not necessarily represent the full scope of the invention, however, and reference is made therefore to the claims and herein for interpreting the scope of the invention.

DETAILED DESCRIPTION OF THE INVENTION

Figure 1:
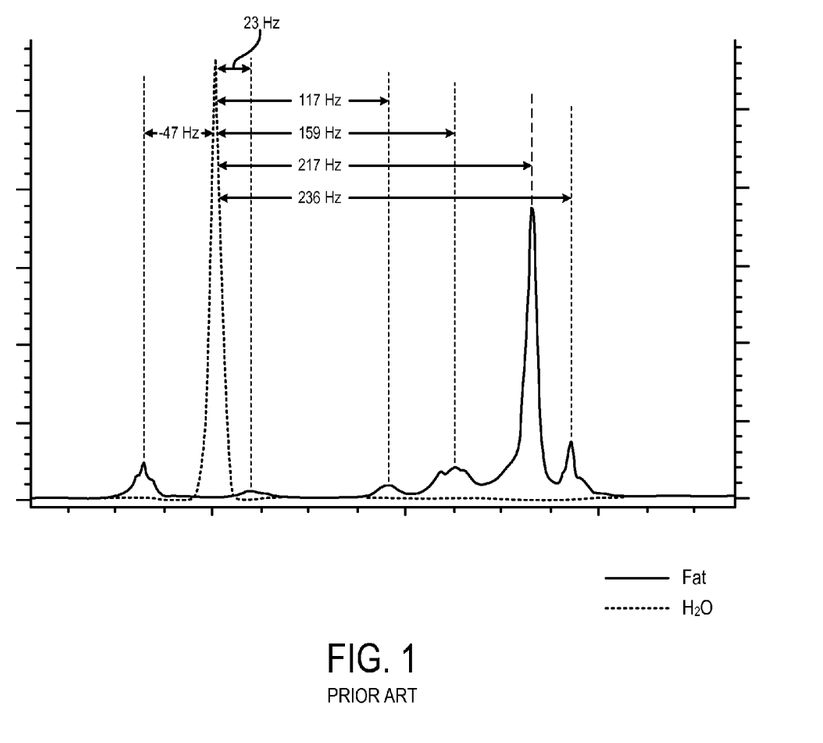
FIG. 1 is an exemplary resonance frequency spectrum for fat at a magnetic field strength of 1.5 Tesla.

A method for water-fat separation and full dynamic range fat quantification using a magnetic resonance imaging ("MRI") acquisition that samples in-phase echoes is provided. Fat-water separation from in-phase echoes is feasible, based on a more accurate model of the fat spectrum, such as a model that accounts for the complex spectral profile of fat, which includes multiple resonance frequencies. An example of such a multi-peak fat resonance frequency spectrum that includes six resonance frequencies is illustrated in FIG. 1. At a magnetic field strength of 1.5 Tesla, the fat spectrum has, relative to the water resonance frequency, peaks at: 47 Hz, −23 Hz, −117 Hz, −159 Hz, −217 Hz, and −236 Hz at body temperature. Commonly, it is only the −217 Hz fat peak that is targeted in fat suppression methods and modeled in water-fat separation methods; however, this leads to undesired effects, especially when performing quantitative studies. In addition to using a multi-peak fat resonance model, a model that accounts for $R^*_2$ decay may also be used. Although using such a model may result in noisier solutions, the water-fat separation will be more accurate.

When performing fat quantification using data acquired by sampling both out-of-phase and in-phase echoes, the fitting used to quantify the amount of fat in a given voxel location will have two local minima in the fitting residual as a function of fat fraction. Because there are two local minima, the fat quantification process may converge on the wrong solution, especially in regions containing a high concentration of fat, such as in adipose tissue. If the solution converges to the wrong minima, then a water-fat swap will occur.

So-called multi-echo Dixon methods for water-fat separation require the acquisition of both in-phase echoes and out-of-phase echoes, as described, for example, by W. T. Dixon in "Simple Proton Spectroscopic Imaging," *Radiology*, 1984; 153(1):189-194. Although conventional wisdom has been that echoes with at least two different relative phases, such as both in-phase echoes and out-of-phase echoes, are required for multi-echo water-fat separation, the inventors have recognized that performing water-fat separation using only multiple in-phase echoes results in a fitting residual with only one local minimum. Because the fitting residual for water-fat separation using only in-phase echoes has only one local minimum, water-fat separation and fat quantification can be performed for a full dynamic range of fat fractions (i.e., from 0-100 percent). Thus, by excluding the out-of-phase data that is conventionally utilized for fat quantification, the accuracy of the fat quantification process is significantly improved.

The local minimum present in fitting only in-phase signals is, however, located in a fairly broad "valley" along the fat-fraction direction. This broad valley results in noisy water-fat separation, but also facilitates water-fat separation without the need for region growing. It is contemplated that the lack of ambiguity in water-fat separation when using in-phase echoes is a result of using a multi-peak model for fat. Because the water and main fat peak are in phase for an in-phase echo, the water-fat separation problem is essentially reduced to separating the combined water and main fat peak from the secondary fat peaks. The secondary fat peaks are generally less than thirty percent of the total signal, so this makes the separation task simpler. Using know relationships between the water peak and main fat peak, the signal contributions from these two peaks can then be reliably separated.

Figure 2A:
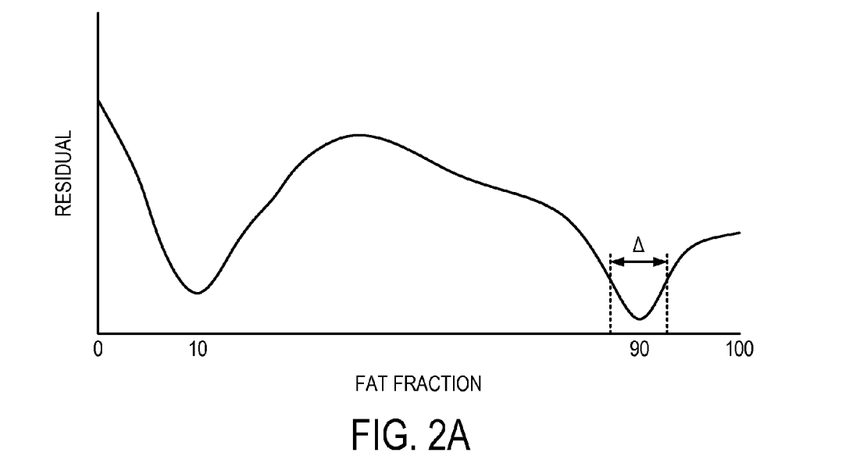
FIG. 2A is a pictorial representation of a fit residual along a one-dimensional profile for a fitting of both out-of-phase echoes and in-phase echoes.
Figure 2B:
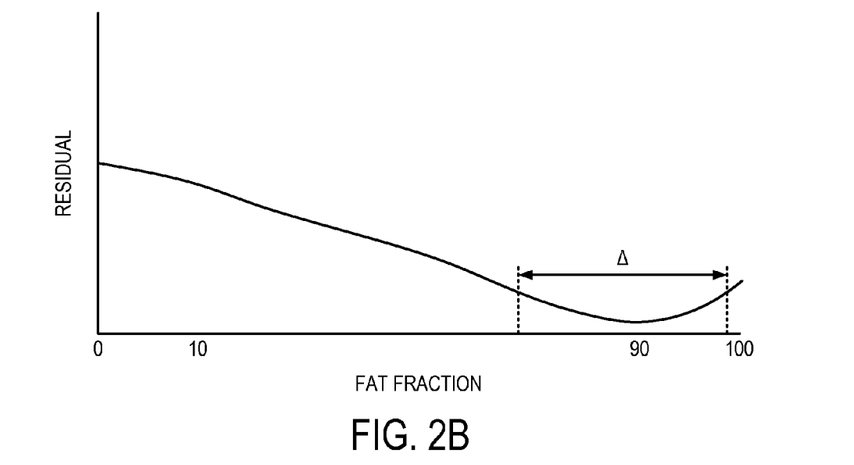
FIG. 2B is a pictorial representation of a fit residual along a one-dimensional profile for a fitting of only in-phase echoes.

By way of example, and referring now to FIGS. 2A and 2B, examples of profiles of fitting residuals as a function of fat-fraction are illustrated for those instances where the images reconstructed from data acquired from both in-phase and out-of-phase echoes (FIG. 2A) are fit to a multi-peak fat signal model, and where the images reconstructed from data acquired from only in-phase echoes (FIG. 2B) are fit to a multi-peak fat signal model. It is noted that this fitting may be of the complex valued images, or of only the magnitude of the images. With the latter approach, the process is insensitive to magnetic field inhomogeneities and phase errors. A small residual value suggests that the acquired signals and the field map value fit the model well, thereby resulting in a correct quantification of fat. It can be seen in FIG. 2A that when both in-phase and out-of-phase signals are fit, the residual will have two local minima. Likewise, it can be seen in FIG. 2B that when only the in-phase signals are fit, the residual will have only one local minimum. However, the width, Δ, of the minima in FIG. 2A are much narrower than that of the minimum in FIG. 2B. As a result, the signal-to-noise of the fat quantification performed with both the in-phase and out-ofphase signals will be much higher than for using the in-phase signals alone. That being said, because the in-phase only fitting has only one local minimum, there is no ambiguity as to whether a voxel should be characterized as fat or water.

Although the results of using only in-phase echoes are noisier than with more conventional echo combinations of out-of-phase and in-phase echoes, the feasibility of water-fat separation highlights the fact that in-phase echoes are not free of oscillations due to the presence of fat. These results suggest that techniques that currently rely on in-phase echoes (e.g., $R^*_2$ mapping) are not fat-corrected.

Using the provided method, water-fat separation can be performed such that ambiguity-free fat quantification can be realized. Because fat quantification using the provided method is ambiguity free, fat quantification metrics, such as fat fraction, can be calculated over a complete dynamic range, such as 0-100 percent. Typically, magnitude fitting of fat is limited to a range of around 0-50 percent, as described for example, by M. Bydder, et al., in "Relaxation Effects in the Quantification of Fat using Gradient Echo Imaging," *Magn. Reson. Imaging,* 2008; 26(3): 347-359.

Figure 3:
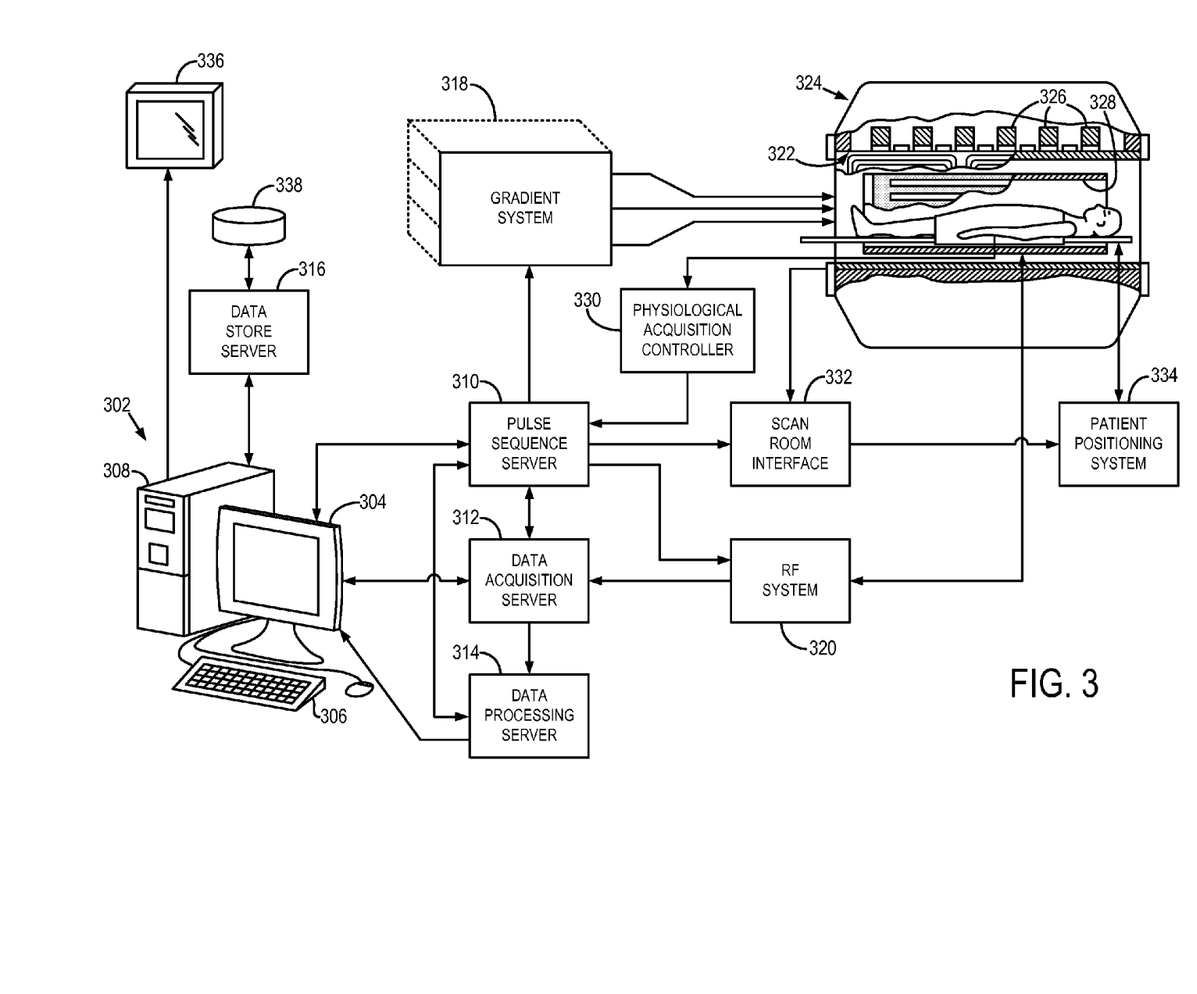
FIG. 3 is a block diagram of an example of a magnetic resonance imaging ("MRI") system that may be used when practicing embodiments of the present invention.

Referring particularly to FIG. 3, an example of a magnetic resonance imaging ("MRI") system is illustrated. The MRI system includes a workstation 302 having a display 304 and a keyboard 306. The workstation 302 includes a processor 308, such as a commercially available programmable machine running a commercially available operating system. The workstation 302 provides the operator interface that enables scan prescriptions to be entered into the MRI system. The workstation 302 is coupled to four servers: a pulse sequence server 310; a data acquisition server 312; a data processing server 314, and a data store server 316. The workstation 302 and each server 310, 312, 314 and 316 are connected to communicate with each other.

The pulse sequence server 310 functions in response to instructions downloaded from the workstation 302 to operate a gradient system 318 and a radio frequency ("RF") system 320. Gradient waveforms necessary to perform the prescribed scan are produced and applied to the gradient system 318, which excites gradient coils in a gradient coil assembly 322 to produce the magnetic field gradients $G_x$, $G_y$, and $G_z$ used for position encoding MR signals. The gradient coil assembly 322 forms a part of a magnet assembly 324 that includes a polarizing magnet 326 and a whole-body RF coil 328.

RF excitation waveforms are applied to the RF coil 328, or a separate local coil (not shown in FIG. 3), by the RF system 320 to perform the prescribed magnetic resonance pulse sequence. Responsive MR signals detected by the RF coil 328, or a separate local coil (not shown in FIG. 3), are received by the RF system 320, amplified, demodulated, filtered, and digitized under direction of commands produced by the pulse sequence server 310. The RF system 320 includes an RF transmitter for producing a wide variety of RF pulses used in MR pulse sequences. The RF transmitter is responsive to the scan prescription and direction from the pulse sequence server 310 to produce RF pulses of the desired frequency, phase, and pulse amplitude waveform. The generated RF pulses may be applied to the whole body RF coil 328 or to one or more local coils or coil arrays (not shown in FIG. 3).

The RF system 320 also includes one or more RF receiver channels. Each RF receiver channel includes an RF amplifier that amplifies the MR signal received by the coil 328 to which it is connected, and a detector that detects and digitizes the I and Q quadrature components of the received MR signal. The magnitude of the received MR signal may thus be determined at any sampled point by the square root of the sum of the squares of the I and Q components:

$$M=\sqrt{I^2+Q^2} \qquad \text{Eqn. (1);}$$

and the phase of the received MR signal may also be determined:

$$\phi = \tan^{-1}\left(\frac{Q}{I}\right). \qquad \text{Eqn. (2)}$$

The pulse sequence server 310 also optionally receives patient data from a physiological acquisition controller 330. The physiological acquisition controller 330 receives signals from a number of different sensors connected to the patient, such as electrocardiograph ("ECG") signals from electrodes, or respiratory signals from a bellows or other respiratory monitoring device. Such signals are typically used by the pulse sequence server 310 to synchronize, or "gate," the performance of the scan with the subject's heart beat or respiration.

The pulse sequence server 310 also connects to a scan room interface circuit 332 that receives signals from various sensors associated with the condition of the patient and the magnet system. It is also through the scan room interface circuit 332 that a patient positioning system 334 receives commands to move the patient to desired positions during the scan.

The digitized MR signal samples produced by the RF system 320 are received by the data acquisition server 312. The data acquisition server 312 operates in response to instructions downloaded from the workstation 302 to receive the real-time MR data and provide buffer storage, such that no data is lost by data overrun. In some scans, the data acquisition server 312 does little more than pass the acquired MR data to the data processor server 314. However, in scans that require information derived from acquired MR data to control the further performance of the scan, the data acquisition server 312 is programmed to produce such information and convey it to the pulse sequence server 310. For example, during prescans, MR data is acquired and used to calibrate the pulse sequence performed by the pulse sequence server 310. Also, navigator signals may be acquired during a scan and used to adjust the operating parameters of the RF system 320 or the gradient system 318, or to control the view order in which k-space is sampled.

The data processing server 314 receives MR data from the data acquisition server 312 and processes it in accordance with instructions downloaded from the workstation 302. Such processing may include, for example: Fourier transformation of raw k-space MR data to produce two or three-dimensional images; the application of filters to a reconstructed image; the performance of a backprojection image reconstruction of acquired MR data; the generation of functional MR images; and the calculation of motion or flow images.

Images reconstructed by the data processing server 314 are conveyed back to the workstation 302 where they are stored. Real-time images are stored in a data base memory cache (not shown in FIG. 3), from which they may be output to operator display 312 or a display 336 that is located near the magnet assembly 324 for use by attending physicians. Batch mode images or selected real time images are stored in a host database on disc storage 338. When such images have been reconstructed and transferred to storage, the data processing server 314 notifies the data store server 316 on the workstation 302. The workstation 302 may be used by an operator to archive the images, produce films, or send the images via a network to other facilities.

Figure 4:
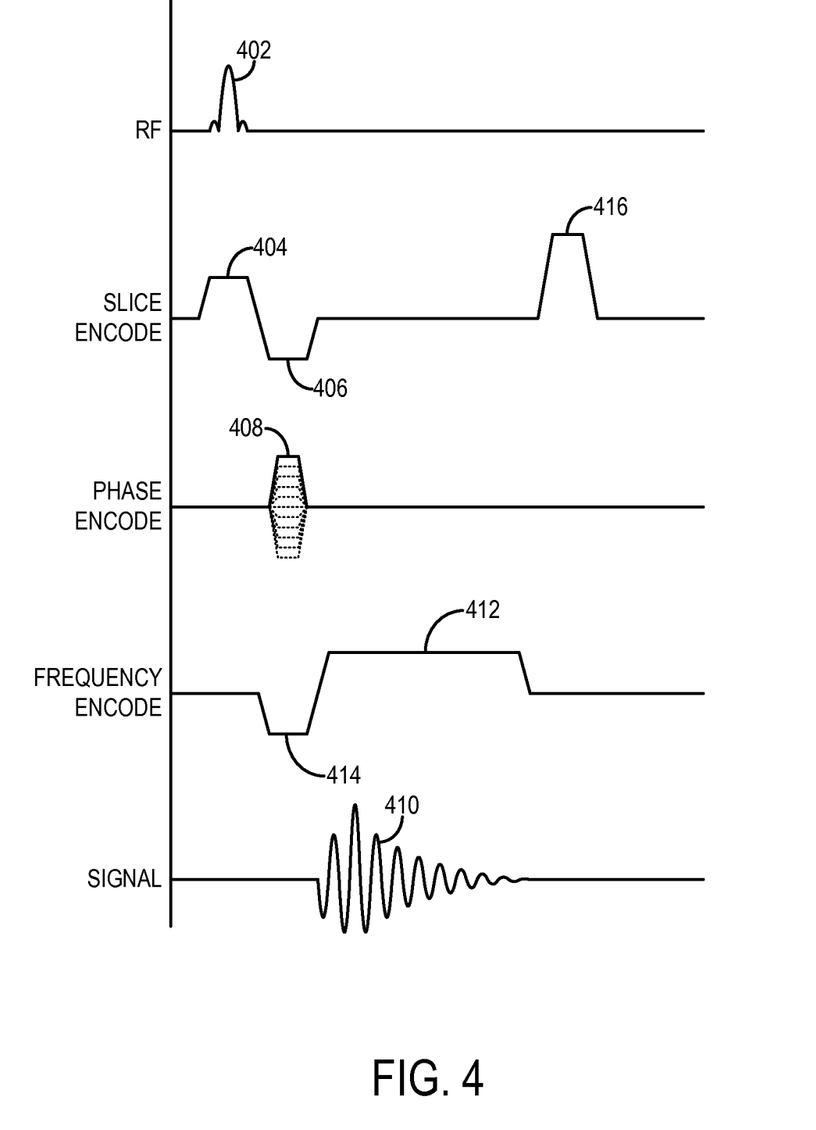
FIG. 4 is a pulse sequence diagram for an example spoiled gradient echo pulse sequence.

An example of a pulse sequence that may be employed to direct the MRI system to acquire image data in accordance with the present invention is illustrated in FIG. 4. Such a pulse sequence is commonly referred to as a spoiled gradient recalled echo ("SPGR") pulse sequence. It will be appreciated, however, that a variety of different pulse sequences can be employed, including fast spin echo ("FSE") sequences, gradient-recalled echo ("GRE") sequences, steady-state free precession ("SSFP") sequences, echo planar imaging ("EPI") sequences, spiral imaging sequences, and radial imaging sequences. Moreover, acquisitions with relatively long echo spacing, or echo time increment, can be employed, even though such echo spacing is traditionally challenging for robust field map estimation. For example, at high magnetic field strengths the increased chemical shift leads to increased phase shifts between water and fat unless the echo spacing is decreased. The method of the present invention, however, can produce an accurate water-fat separation, even in light of these pulse sequence choices.

The exemplary SPGR pulse sequence includes a spatially selective radio frequency ("RF") excitation pulse 402 that is repeated at the start of each repetition time ("TR") period. Moreover, the RF excitation pulse 402 is played out in the presence of a slice-selective gradient 404 in order to produce transverse magnetization in a prescribed imaging slice. The slice selective gradient 404 includes a rephasing lobe 406 that acts to rephase unwanted phase accruals caused by the RF excitation pulse 402. Following excitation of the nuclear spins in the prescribed imaging slice, a phase encoding gradient 408 is applied to spatially encode a nuclear magnetic resonance signal, representative of a gradient-recalled echo 410, along one direction in the prescribed imaging slice. A readout gradient 412 is also applied after a dephasing gradient lobe 414 to spatially encode the signal representative of the echo 410 along a second, orthogonal direction in the prescribed imaging slice. The signal representative of the echo 410 is sampled during a data acquisition window.

A rewinder gradient 416 is played out along the phase-select gradient axis in order to rephase remaining transverse magnetization in preparation for subsequent repetitions of the pulse sequence. As is well known in the art, the pulse sequence is repeated and the amplitude of the phase encoding gradient 408 and the rewinder 416, which is equal in amplitude and area, but opposite in polarity with respect to the phase encoding gradient 408, are stepped through a set of values such that k-space is sampled in a prescribed manner. The pulse sequence concludes with the application of a spoiler gradient 418 that spoils the remaining transverse magnetization.

As will be explained in more detail below, image data is acquired a plurality of times from each prescribed imaging slice, and the echo time ("TE") is incremented during successive repetitions such that N sets of image data corresponding to N different echo times are acquired for each prescribed imaging slice. Alternatively, the N sets of image data can be acquired at N different echo times within the same TR period. Furthermore, the N sets of image data can be acquired at multiple TRs, each collecting a subset of image data. By way of example, the successive echo times are spaced apart such that the echoes formed at each echo time are in-phase echoes that have water and main fat peak signals that are in-phase. It is noted that any number of multiple echoes can be acquired when practicing the present invention.

Figure 5:
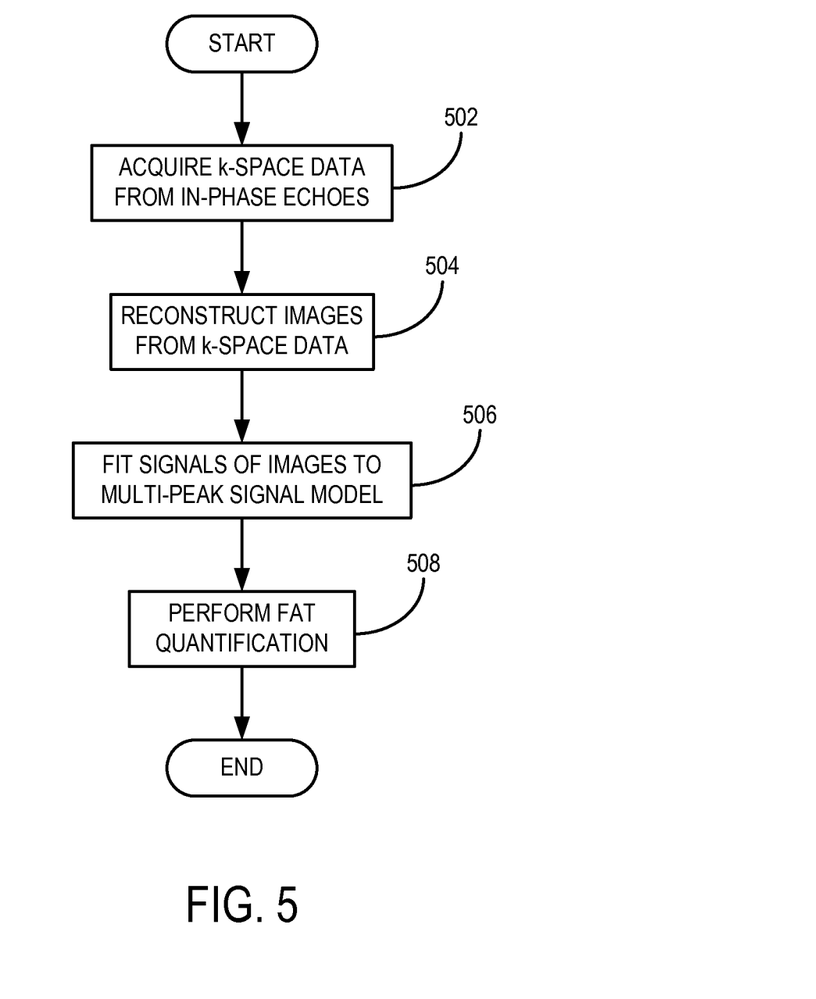
FIG. 5 is a flowchart setting forth the steps of an example of a method for performing water-fat separation and calculating a fat fraction with a full dynamic range by fitting in-phase echoes to a signal model that account for a fat spectrum with multiple resonance peaks.

Referring now to FIG. 5, a flowchart setting forth the steps of an example of a method for performing water-fat separation and calculating a fat fraction with a full dynamic range using fitting of in-phase echoes is illustrated. The method begins with the acquisition of k-space data from a subject, as indicated at step 502. Contrary to other multi-echo Dixon methods, k-space data is acquired by sampling only in-phase echoes, in which water and main peak fat signals are in-phase with each other. It is contemplated that the echoes do not need to be exactly in-phase, but that some degree of relative phase shift between the water and main fat peak will still provide acceptable results. Thus, the water and main fat peaks may be substantially in-phase with each other. Next, images are reconstructed from the acquired k-space data, as indicated at step 504. These are then fit to a multi-peak signal model, as indicated at step 506. For example, the magnitudes of these in-phase images are fit to a signal model that models the fat resonance spectrum as having a main peak and multiple secondary peaks. When magnitude fitting is used, the method is insensitive to magnetic field inhomogeneities and phase errors. In other application, the complex-valued images may be fit to the signal model.

After the fitting, the relative signal contributions of the water and fat signals are determined. It will be appreciated by those skilled in the art that multi-echo Dixon methods, such as IDEAL or the multi-echo magnitude-based approach described by M. Bydder, et al., may be used when practicing the present invention. Using the separated water and fat signal contributions, a fat quantification metric, such as fat fraction, may be calculated, as indicated at step 508. Because only in-phase echo signals are used for the fitting, the fat quantification process is substantially ambiguity free and the fat fraction values for voxel locations will be properly characterized over a full dynamic range of 0-100 percent. This lack of ambiguity in the fat quantification process stems from the existence of only a single local minimum in the fitting of in-phase signals to the signal model, as discussed in detail above.

Figure 6:
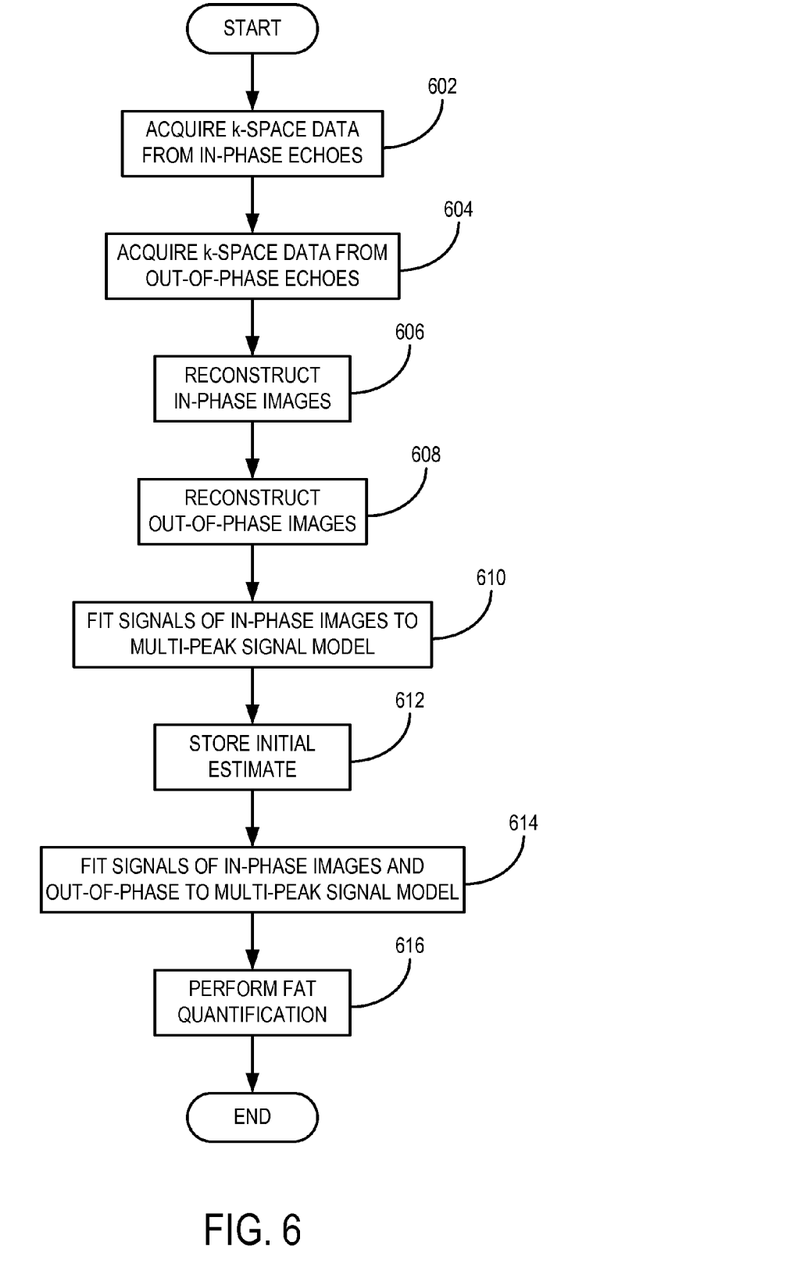
FIG. 6 is a flowchart setting forth the steps of an example method for performing water-fat separation and calculating a fat fraction with a full dynamic range by fitting in-phase echoes to a signal model that account for a fat spectrum with multiple resonance peaks, and in which signal-to-noise ratio of the fat fraction is improved by using out-of-phase echoes.

Referring now to FIG. 6, a flowchart setting forth the steps of an example method for performing water-fat separation and calculating a fat fraction with a full dynamic range using fitting of in-phase echoes, and in which signal-to-noise ratio of the fat fraction is improved by using out-of-phase echoes, is illustrated. In this method, k-space data is acquired from both in-phase and out-of-phase echoes, as indicated at steps 602 and 604. It will be appreciated by those skilled in the art that the in-phase and out-of-phase echoes may be acquired in the same repetition time period, or in subsequent acquisitions. From these k-space data sets, in-phase and out-of-phase images are reconstructed, as indicated at steps 606 and 608. As before, either the magnitude or complex values of signals in the in-phase images are then fit to a multi-peak signal model to perform ambiguity-free water-fat separation, as indicated at step 610. As discussed above, while this technique is highly accurate, it is also noisy. Therefore, the information provided by this signal separation is stored, as indicated at step 612, and used as an initial estimate for a subsequent fitting using both the in-phase and out-of-phase echoes.

As indicated at step 614, the method proceeds by fitting both the in-phase and out-of-phase images to a multi-peak signal model. Again, the fitting may be of the magnitudes or complex values of signals in the images. However, this fitting is performed using the initial estimates of separated water and fat signals from the in-phase fitting as an initial value. Because this information is used, the fitting process will avoid water-fat swapping because using the initial estimate avoids the possibility of converging on the improper local minima. After this second fitting is performed, a high signal-to-noise ratio ("SNR"), accurate separation of water and fat signal contributions is achieved. Using this signal separation, an ambiguity free and high SNR fat quantification may be performed, as indicated at step 616, typically calculated as a fat-water ratio, or as a fat fraction. Method to avoid noise related bias may also be used at this stage. Examples of such methods for avoiding noise bias are described, for example, by C. Y. Liu, et al., in "Fat Quantification with IDEAL Gradient Echo Imaging: correction of Bias from T(1) and Noise," *Magnetic Resonance in Medicine,* 2007; 58(2):354-364.

The provided method is advantageous for imaging in general, but especially so in those anatomical locations where water-fat ambiguities are likely. By way of example, this method is highly advantageous for imaging bone marrow, where fat fraction often exceeds fifty percent. Hematopoietic bone marrow can often be mischaracterized during fat quantification, leading to instances where the otherwise healthy tissue is treated as potentially cancerous. For radiotherapy treatments, it is crucial to properly characterize hematopoietic bone marrow, less these tissue be improperly characterized as cancerous and, therefore, irradiated. The provided method is also advantageous for $R_2^*$ mapping techniques, which require an accurate characterization of tissue. The provided method is also advantageous for improving or eliminating the need for region growing methods with complex data. By way of example, the provided method may be useful for performing IDEAL near metal objects, such as surgical implants.

The present invention has been described in terms of one or more preferred embodiments, and it should be appreciated that many equivalents, alternatives, variations, and modifications, aside from those expressly stated, are possible and within the scope of the invention.

The invention claimed is:

1. A method for producing an image of a subject with a magnetic resonance imaging (MRI) system in which signal contributions of water and fat are separated, the steps of the method comprising:
   a) acquiring k-space data with the MRI system by sampling a plurality of echo signals that are formed at a plurality of different echo times that occur when signal contributions of water and fat are substantially in-phase with each other;
   b) separating signal contributions of water and fat by fitting only those of the plurality of echo signals having water and fat substantially in-phase with each other to a signal model that models a fat spectrum as including multiple resonance peaks; and
   c) producing an image of the subject depicting a desired amount of signal contribution from water and a desired amount of signal contribution from fat using the signal contributions separated in step b).

2. The method as recited in claim 1 in which step b) includes fitting the magnitudes only.

3. The method as recited in claim 1 further comprising calculating a fat quantification metric using the signal contributions separated in step b).

4. The method as recited in claim 3 in which the fat quantification metric is a fat fraction and values of the fat fraction range from at least zero to at most one hundred.

5. The method as recited in claim 3 further comprising producing a fat-corrected $R_2^*$ map over the fat fraction range of at least zero to at most one hundred using the signal contributions separated in step b).

6. The method as recited in claim 1 further comprising:
   d) acquiring k-space data with the MRI system by sampling a plurality of out-of-phase echo signals that are formed at a plurality of different echo times that occur when signal contributions of water and fat are out-of-phase with each other; and
   e) improving a signal-to-noise ratio of the image produced in step c) using the k-space data acquired in step d).

7. The method as recited in claim 6 in which step e) includes:
   i) selecting the signal contributions separated in step b) as initial estimate values; and
   ii) separating signal contributions of water and fat by fitting the plurality of in-phase echo signals and the plurality of out-of-phase echo signals to a signal model that models a fat spectrum as including multiple resonance peaks, wherein the initial estimate values selected in step e)i) are used to avoid convergence at an incorrect local minimum.

8. The method as recited in claim 1 in which step b) includes reconstructing an image for each of the plurality of different echo times from the k-space data acquired in step a) and fitting signals depicted in each reconstructed image to the signal model.

9. The method as recited in claim 1 in which the image produced in step c) is a water image and the desired amount of signal contribution from fat is substantially zero.

10. The method as recited in claim 1 in which the image produced in step c) is a fat image and the desired amount of signal contribution from water is substantially zero.

11. A magnetic resonance imaging (MRI) system comprising:
    a magnet system configured to generate a polarizing magnetic field about at least a portion of a subject arranged in the MRI system;
    a plurality of gradient coils configured to apply at least one gradient field to the polarizing magnetic field;
    a radio frequency (RF) system configured to apply an RF field to the subject and to acquire magnetic resonance (MR) image data therefrom;
    a computer system programmed to:
      direct the MRI system to acquire MR image data from a subject by sampling a plurality of echo signals that are formed at a plurality of different echo times that occur when signal contributions of water and fat are substantially in-phase with each other;
      separate signal contributions of water and fat by fitting only those of the plurality of echo signals having water and fat substantially in-phase with each other to a signal model that models a fat spectrum as including multiple resonance peaks; and
      produce an image of the subject depicting a desired amount of signal contribution from water and a desired amount of signal contribution from fat using the separated signal contributions.

12. The MRI system as recited in claim 11 in which the computer system is further programmed to calculate a fat quantification metric using the separated signal contributions.

13. The MRI system as recited in claim 11 in which the computer system is further programmed to calculate a fat fraction using the separated signal contributions such that values of the fat fraction range from at least zero to at most one hundred.

14. The MRI system as recited in claim 11 in which the computer system is further programmed to:

direct the MRI system to acquire MR image data by sampling a plurality of out-of-phase echo signals that are formed at a plurality of different echo times that occur when signal contributions of water and fat are out-of-phase with each other; and improving a signal-to-noise ratio of the produced image of the subject using the out-of-phase MR image data.

15. The MRI system as recited in claim 14 in which the computer system is further programmed to:

select the separated signal contributions as initial estimate values; and separate signal contributions of water and fat by fitting the plurality of in-phase echo signals and the plurality of out-of-phase echo signals to a signal model that models a fat spectrum as including multiple resonance peaks while using the selected initial estimate values to avoid convergence at an incorrect local minimum.

16. The MRI system as recited in claim 11 in which the computer system is programmed to:

reconstruct an image for each of the plurality of different echo times from the MR image data acquired; and separate signal contributions of water and fat by fitting the reconstructed images to a signal model that models a fat spectrum as including multiple resonance peaks.

17. The MRI system as recited in claim 11 in which the computer system is further programmed to:

direct the MRI system to acquire MR image data by sampling a plurality of out-of-phase echo signals that are formed at a plurality of different echo times that occur when signal contributions of water and fat are out-of-phase with each other; and improve a signal-to-noise ratio of the produced image of the subject using the out-of-phase MR image data.

18. The MRI system as recited in claim 17 in which the computer system is further programmed to use the separated signal contributions as the initial estimated values and separate signal contributions of water and fat by fitting the plurality of in-phase echo signals and the plurality of out-of-phase echo signals to a signal model that models a fat spectrum as including multiple resonance peaks while using the selected initial estimate values to avoid convergence at an incorrect local minimum.

19. A magnetic resonance imaging (MRI) system comprising:

a magnet system configured to generate a polarizing magnetic field about at least a portion of a subject arranged in the MRI system;

a plurality of gradient coils configured to apply at least one gradient field to the polarizing magnetic field;

a radio frequency (RF) system configured to apply an RF field to the subject and to acquire magnetic resonance (MR) image data therefrom;

a computer system programmed to:

direct the MRI system to acquire MR image data from a subject by sampling a plurality of echo signals that are formed at a plurality of different echo times that occur when signal contributions of water and fat are substantially in-phase with each other;

select initial estimate values of separated signal contributions of water and fat;

separate signal contributions of water and fat by fitting only those of the plurality of echo signals having water and fat substantially in-phase with each other to a signal model that models a fat spectrum as including multiple resonance peaks while using the selected initial estimate values to avoid convergence at an incorrect local minimum; and produce an image of the subject depicting a desired amount of signal contribution from water and a desired amount of signal contribution from fat using the separated signal contributions.

\* \* \* \* \*